(12) United States Patent
Murowaki et al.

(10) Patent No.: US 6,341,066 B1
(45) Date of Patent: Jan. 22, 2002

(54) ELECTRONIC CONTROL UNIT HAVING DRIVE ELEMENT AND CONTROL PROCESSING ELEMENT

(75) Inventors: Toru Murowaki, Chiryu; Toshiaki Yagura, Nakata-gun; Yoshitaka Nakano, Chiryu; Taku Iida, Kariya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/672,498

(22) Filed: Sep. 29, 2000

(30) Foreign Application Priority Data

| Sep. 30, 1999 | (JP) | ............................................ | 11-279301 |
| Oct. 5, 1999 | (JP) | ............................................ | 11-284218 |
| Oct. 8, 1999 | (JP) | ............................................ | 11-288398 |

(51) Int. Cl.[7] ................................................ H05K 7/20
(52) U.S. Cl. ........................ 361/707; 257/723; 361/719; 361/789
(58) Field of Search ................................ 165/80.3, 185; 257/687, 691, 706, 707, 712, 713, 723, 724; 361/704, 705, 707, 710, 711, 752, 717–719, 784, 785, 789; 29/832, 840, 841, 856; 438/108, 122

(56) References Cited

U.S. PATENT DOCUMENTS

| 4,689,721 | A | * | 8/1987 | Damerow et al. ........... 361/707 |
| 5,040,994 | A | * | 8/1991 | Nakamoto et al. ......... 439/76.1 |
| 5,408,383 | A | | 4/1995 | Nagasaka et al. |
| 5,519,252 | A | | 5/1996 | Soyano et al. |
| 5,657,203 | A | * | 8/1997 | Hirao et al. ................. 361/707 |
| 6,031,730 | A | * | 2/2000 | Kroske ........................ 361/784 |

FOREIGN PATENT DOCUMENTS

| JP | 1-147850 | 6/1989 |
| JP | 6-21330 | 1/1994 |

* cited by examiner

*Primary Examiner*—G P Tolin
(74) *Attorney, Agent, or Firm*—Pillsbury Winthrop LLP

(57) ABSTRACT

In an electronic control unit, a drive element liable to generate heat and a control processing element liable to be affected by heat are respectively mounted on a drive circuit board and a control circuit board different from each other, and the two boards are connected to each other by a flexible printed circuit board. The bonding portion of the flexible printed circuit board to the control circuit board is a back side portion of a connector mounted on the control circuit board at the same side as the control processing element. Therefore, heat generated by the drive element is suppressed from being transferred to the control processing element without causing layout hindrances.

30 Claims, 11 Drawing Sheets

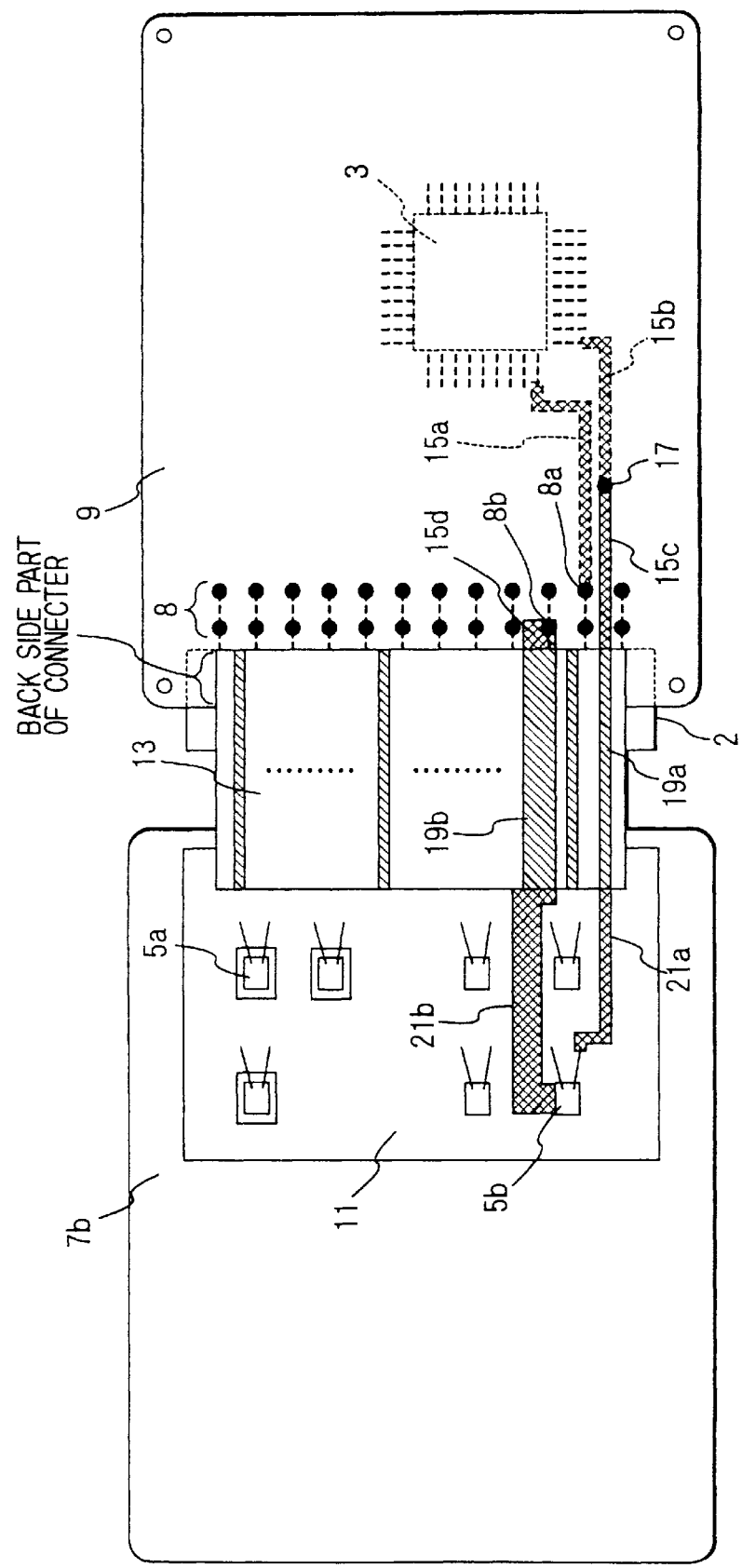

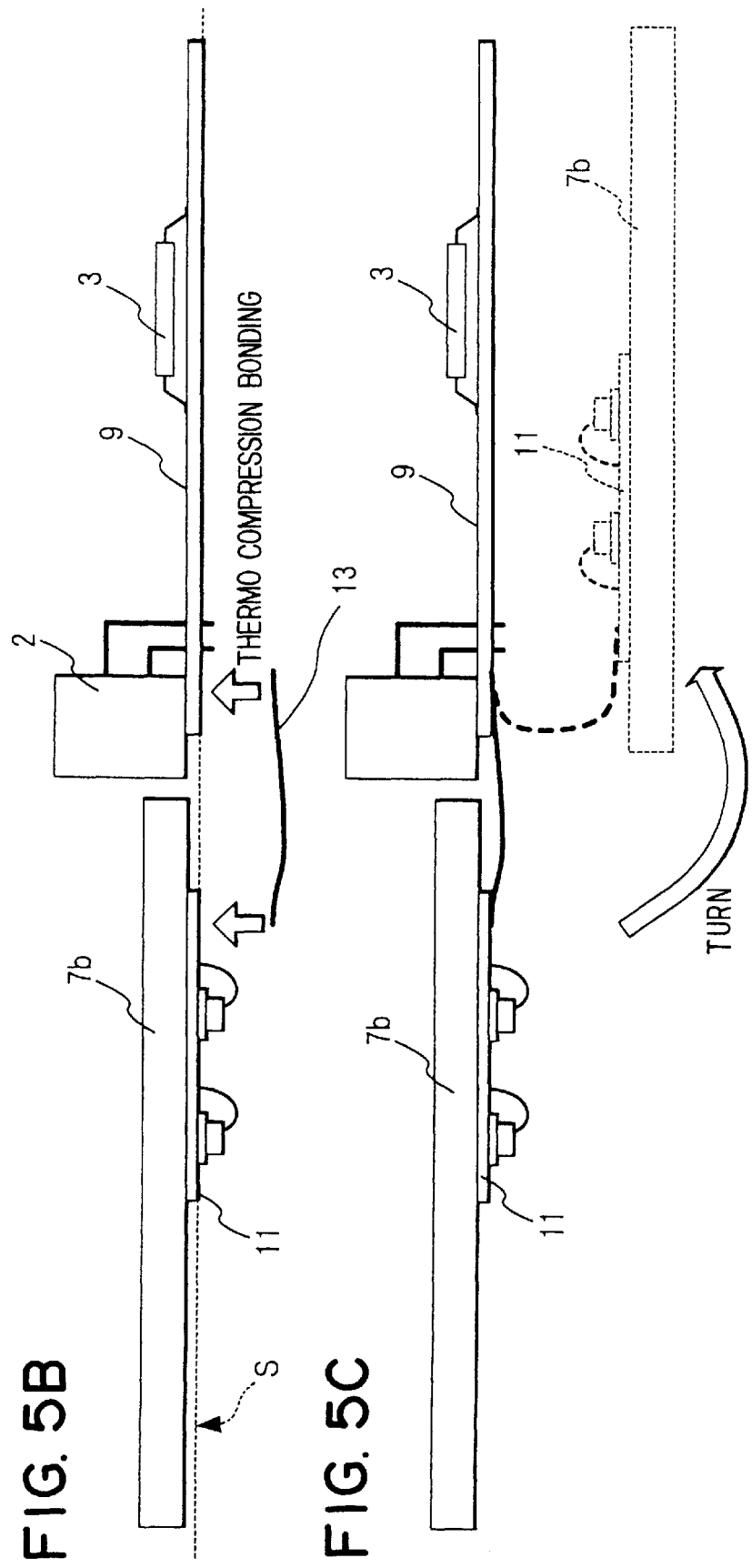

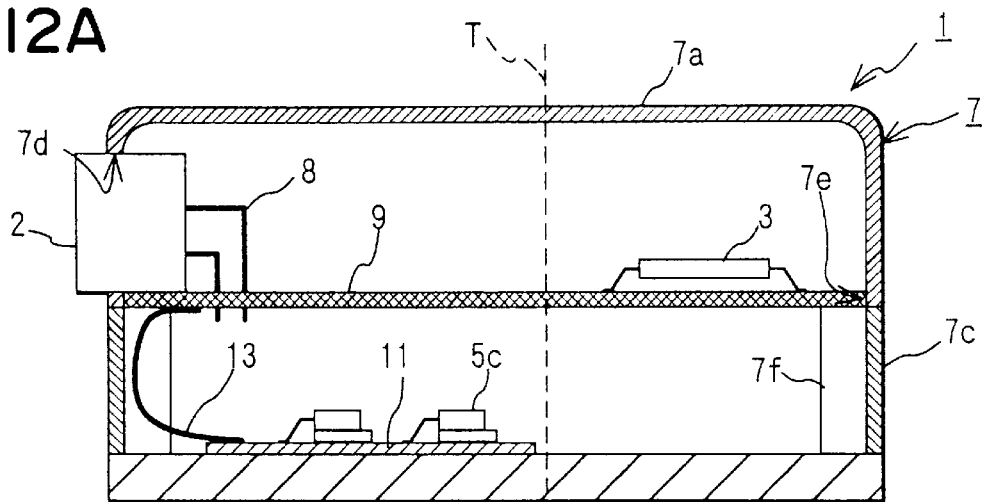
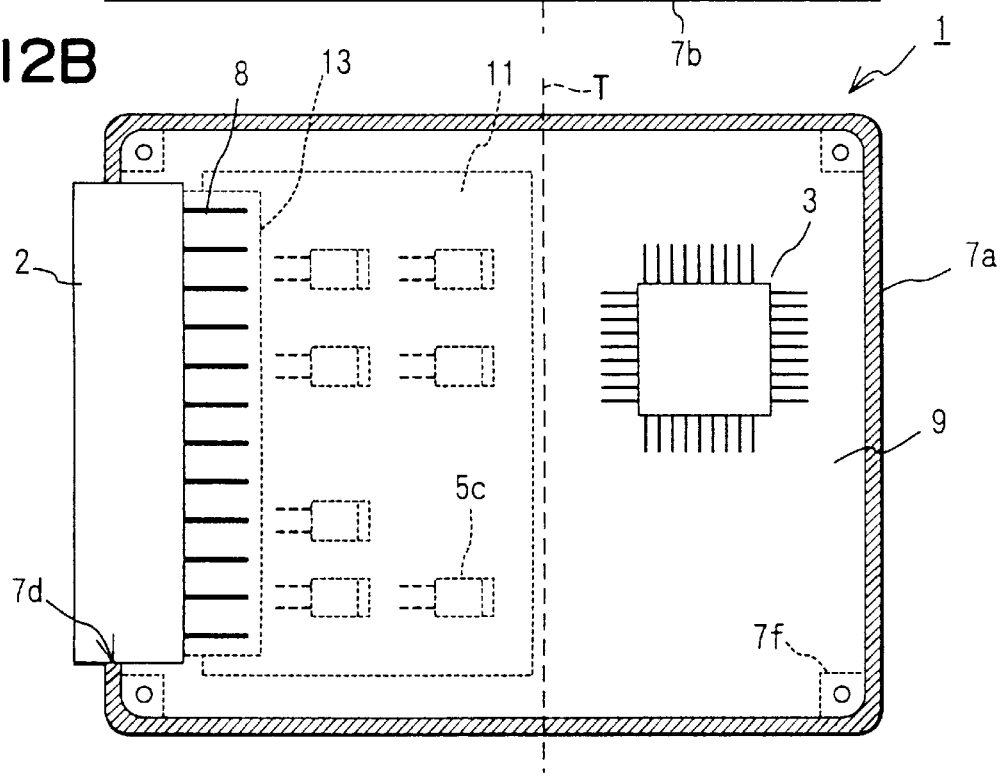

ions No. 11-279301 filed on Sep. 30, 1999, and No. 11-284218 filed on Oct. 5, 1999, and No. 11-288398 filed on Oct. 8, 1999, the contents of which are incorporated herein by reference.

BACKGROUND OF THE INVENTION

1. Field of the Invention

This invention relates to an electronic control unit for drive-controlling an outside control object, and a manufacturing method thereof.

2. Description of the Related Art

There have been known electronic control units (for example electronic control units for mounting in vehicles, which perform engine control or transmission control) for supplying electrical power to and thereby driving outside control objects (for example various actuators such as electromagnetic solenoids) and controlling their operation.

This kind of electronic control unit, for example as shown in FIGS. 1A and 1B, is made by housing a connector 102, a control processing element 103 and drive elements 105 in a box 107. The control processing element 103 performs computational processing on the basis of signals inputted from outside via the connector 102 and outputs control signals. The control processing element 103 is for example a CPU or a microcomputer. The drive elements 105 are for being driven by control signals from the control processing element 103 and supplying power to outside control objects, and are for example power transistors or power ICs.

In this kind of electronic control unit, from the point of view of productivity improvement and cost reduction, the control processing element 103 and the drive elements 105 have been mounted on the same circuit board 109 as shown in FIGS. 1A and 1B. However, the drive elements 105 handle large currents (i.e. electrical powers) compared to the control processing element 103 and so on, and produce a large amount of heat. On the other hand, the control processing element 103, which performs various computational processing, readily suffers influences of heat, and consequently there is a possibility of heat produced by the drive elements 105 excessively raising the temperature of the control processing element 103 and making its operation unstable.

Generally, because the circuit board 109 on which the control processing element 103 and the drive elements 105 are mounted uses a board made of resin having a relatively low thermal conductivity among the various circuit boards, the positional relationship between the two has been considered for example by separating the control processing element 103 and the drive elements 105 as much as possible on the board. By this being done, it has been made difficult for heat produced by the drive elements 105 to reach the control processing element 103. Incidentally, FIG. 1A shows the construction of the electronic control unit as seen from a direction parallel with the board face of the circuit board 109, and FIG. 1B shows the electronic control unit as seen from a direction perpendicular to the board face of the circuit board 109.

However, in electronic control units of recent years, due to complicated and multifunctionalized control content, the increase in number of the drive elements 105 and the increase in power handled by the drive elements 105 have progressed. Further, along with this the amount of heat produced in the drive elements 105 is in an increasing trend. In this case, it is conceivable to suppress thermal influences on the control processing element 103 by making the circuit board 109 larger and further separating the control processing element 103 from the drive elements 105. However, when the space for mounting the electronic control unit is restricted (for example in cases such as when the electronic control unit is to be mounted in a vehicle), there is a limit from the point of view of saving space. Further, when the area of the circuit board 109 is made large, the manufacturing yield of the circuit board 109 deteriorates, and as a result the manufacturing cost of the electronic control unit can be increased.

Because of this in electronic control units of recent years it has been becoming not easy to suppress thermal influences affected on the control processing element 103 by heat produced in the drive elements 105. Further, as the amount of heat produced in the drive elements 105 increases, it may exceed the limit of the thermal radiation capacity in the electronic control unit. In such case, heat produced in the drive elements 105 is not sufficiently dissipated, and not only the control processing element 103 but also the operation of the drive elements 105 may become unstable.

SUMMARY OF THE INVENTION

The present invention has been made in view of the above problems. An object of the present invention is, in an electronic control unit, to improve operational reliability against heat while suppressing increase in size and increase in manufacturing cost of the electronic control unit.

According to the present invention, in an electronic control unit, a drive circuit board holding a drive element for supplying power to an outside control object is disposed on a drive circuit board, and a control processing element for outputting a control signal to the drive element to control the outside control object is disposed on a control circuit board. A connector through which a signal is inputted into the control processing element and the power is supplied to the outside control object is further disposed on the control circuit board. The drive circuit board and the control circuit board are disposed in a box to face each other and connected by a connecting wire.

Preferably, the connecting wire is connected to the control circuit board at a bonding portion in a vicinity of the connector. The connecting wire can be bonded to mutually facing end parts of the control circuit board and the drive circuit board, be bent to form a gap with a wall of the box, and have a length that allows the control circuit board and the drive circuit board to be lined up in an identical plane without an overlap.

Preferably, the control processing element and the drive element are disposed at opposite sides to each other with a plane interposed therebetween, the plane being approximately perpendicular to an inner wall of the box on which the drive circuit board is disposed.

According to the present invention described as above, heat generated in the drive element is suppressed from being transferred to the control processing element, and the operational reliability against heat of the electronic control unit is improved while suppressing increase in size and increase in manufacturing cost.

BRIEF DESCRIPTION OF THE DRAWINGS

Other objects and features of the present invention will become more readily apparent from a better understanding of the preferred embodiments described below with reference to the following drawings, in which;

FIG. 4 is an explanatory view for explaining an example of how signals flow in the control circuit board and a drive circuit board connected to each other with a flexible board;

FIGS. 5A to 5C are explanatory views showing a procedure for connecting the control circuit board and the drive circuit board with the flexible board;

FIG. 12A is an explanatory view showing a modified electronic control unit as seen in a direction parallel with a control circuit board in the present invention; and FIG. 12B is an explanatory view showing the modified electronic control unit as seen in a direction perpendicular to the control circuit board.

DETAILED DESCRIPTION OF THE PREFERRED EMBODIMENTS

Preferred embodiments of the invention will now be described along with the drawings.

First Embodiment

Figure 1A:
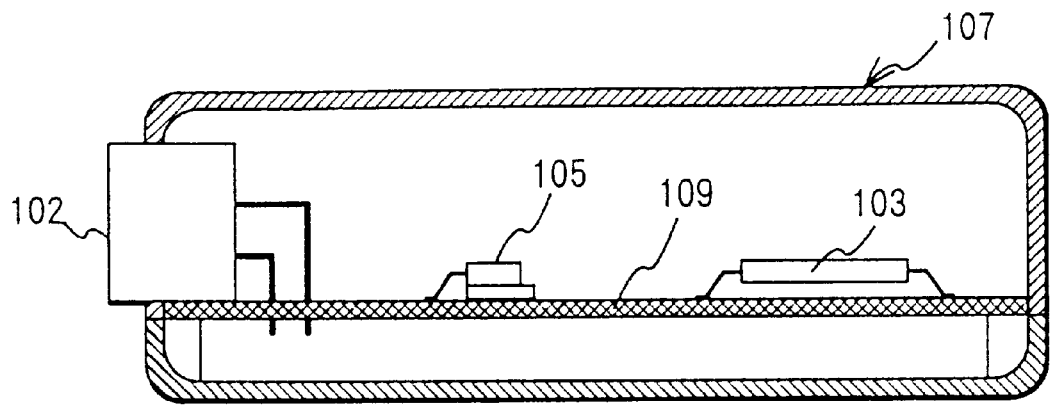
FIG. 1A is an explanatory view showing a conventional electronic control unit as seen from a direction parallel with a circuit board.
Figure 1B:
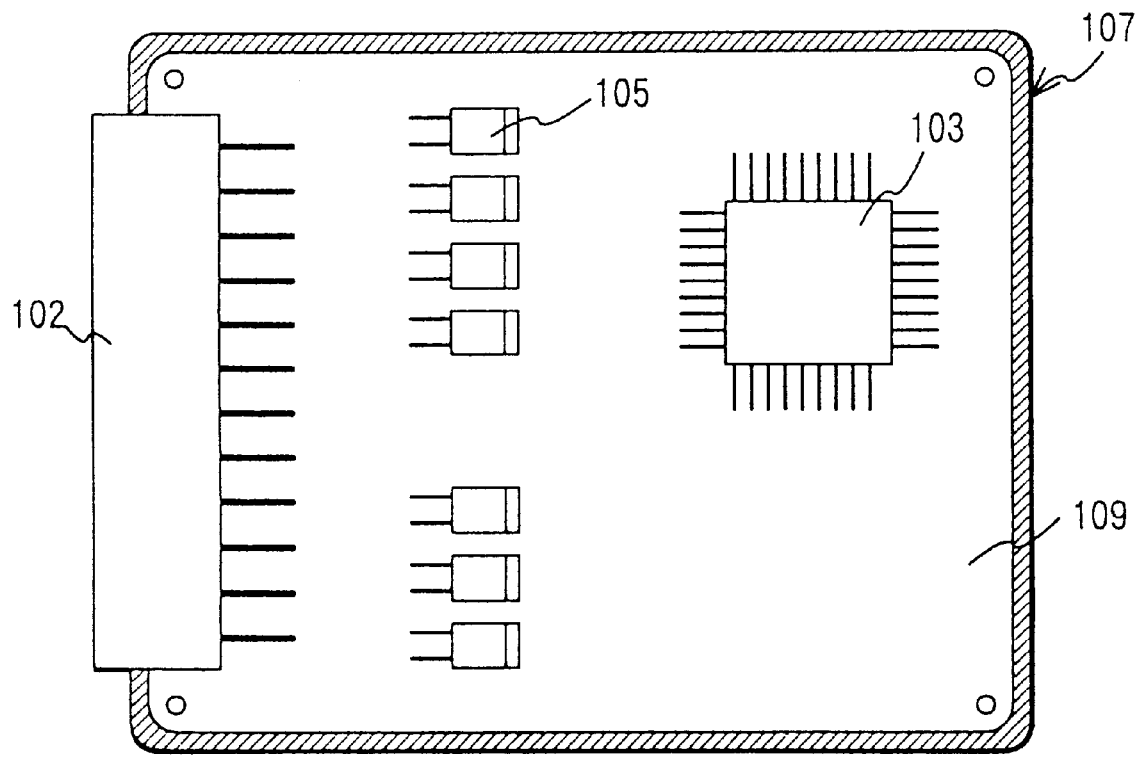
FIG. 1B is an explanatory view showing the conventional electronic control unit as seen from a direction perpendicular to the circuit board.
Figure 2A:
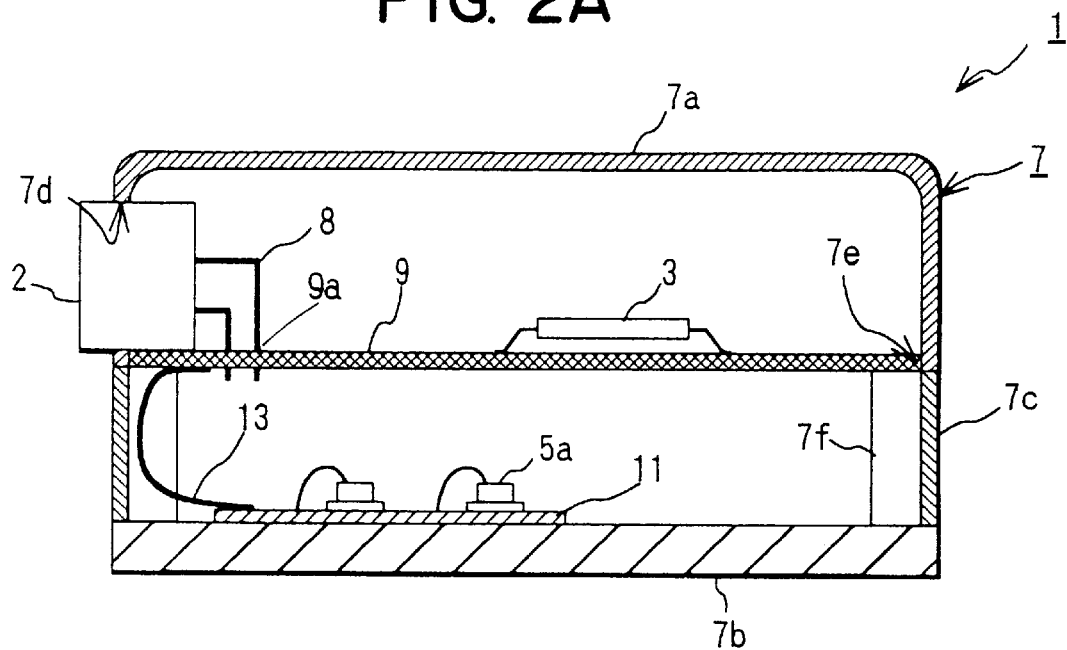
FIG. 2A is an explanatory view showing an electronic control unit as seen from a direction parallel with a control circuit board in a first preferred embodiment.
Figure 2B:
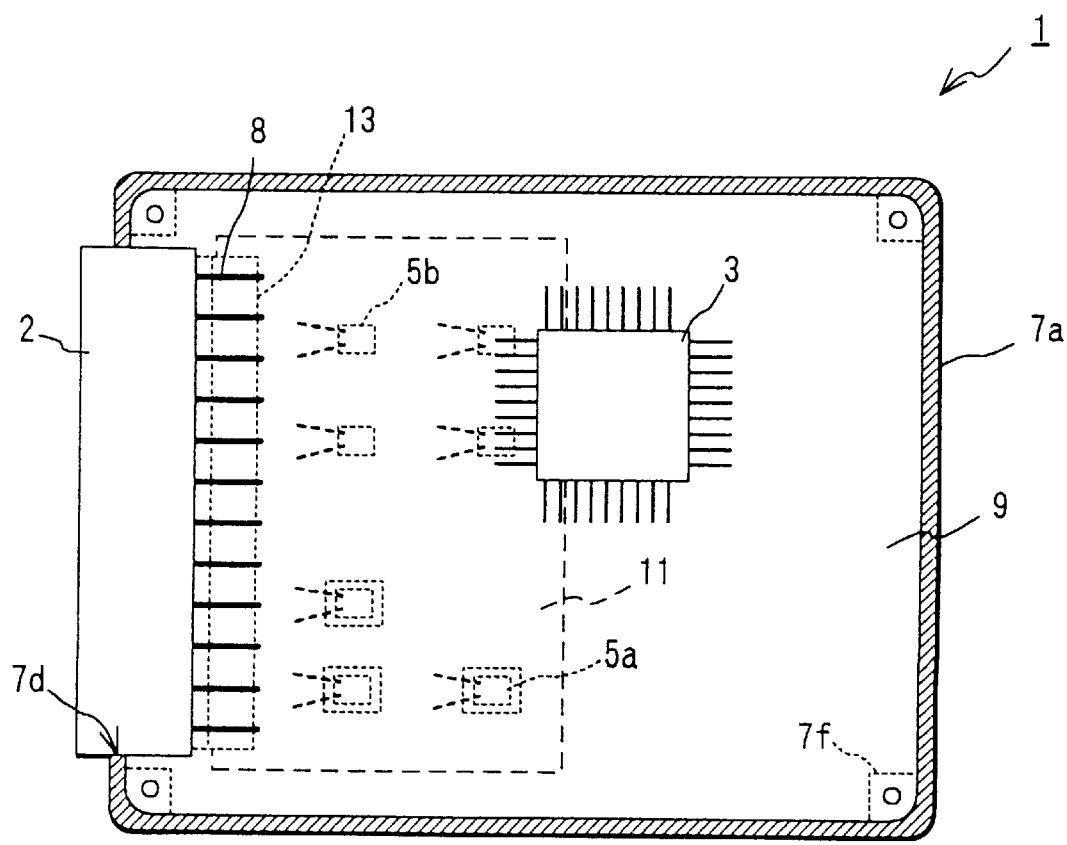
FIG. 2B is an explanatory view showing the electronic control unit as seen from a direction perpendicular to the control circuit board in the first embodiment.

FIGS. 2A and 2B show a construction of an electronic control unit 1 in a first preferred embodiment. This electronic control unit 1 performs engine control by driving and controlling various actuators (control objects such as ignition plugs, electromagnetic solenoids and so on, not shown) provided in an engine (not shown) of a vehicle. The electronic control unit 1 has a connector 2, a control processing element 3 and drive elements 5 (5a, 5b).

The connector 2 is for the electronic control unit 1 to achieve delivery and receipt of signals between itself and the outside control objects. The control processing element 3 of this embodiment is a microcomputer constructed as a so-called one chip microcomputer, and by way of this connector 2 takes in input signals from various sensors detecting the running state of the engine, carries out control processing (computational processing) based on those input signals, and outputs control signals corresponding to results of the control processing to the drive elements 5. The control processing element 3 also carries out communication with various electronic devices (not shown) mounted in the vehicle by way of the connector 2.

The control processing element 3 is accommodated inside a box 7 constituting the outer form of the electronic control unit 1, and is mounted on a control circuit board 9 inside this box 7. The control circuit board 9 is a resin board (in this embodiment, a board having glass cloth as a base material, and epoxy resin impregnated into the base material), for forming a control circuit for controlling outside actuators. Besides the control processing element 3 a number of other electronic components (not shown) are also mounted on this control circuit board 9, and constitute a predetermined control circuit together with the control processing element 3.

In the control circuit comprising the control processing element 3, to take account of the fact that signals from outside sensors (not shown) and many signals such as communication signals from outside electronic devices are handled, and to take account of ease of mounting, the connector 2 is provided on the control circuit board 9. The connector 2 has connector pins 8 for electrically connecting the connector 2 to a predetermined circuit board, and is electrically connected to interconnection patterns on the control circuit board 9 via these connector pins 8. The connector pins 8 are fixed to the control circuit board 9 in a state where the pins 8 are inserted into through holes 9a formed in the control circuit board 9.

The control circuit board 9 is disposed in parallel with a drive circuit board 11 (which will be discussed later) so that its board face and the board face of the drive circuit board 11 face each other. The connector 2 and the control processing element 3 are provided on the back side face (i.e. the upper face) of the face (in FIG. 2A, the lower face) of the control circuit board 9 facing the drive circuit board 11. Furthermore the connector 2 is disposed on an end part of the back side face of the control circuit board 9. FIG. 2A shows the construction of the electronic control unit 1 as seen from a direction parallel with the board face of the control circuit board 9, and FIG. 2B shows the electronic control unit 1 as seen from a direction perpendicular to the board face of the control circuit board 9.

The drive elements 5, on the other hand, are for supplying power to actuators of the engine and driving them. That is, the drive elements 5 are so-called switching elements and are provided in power paths leading from an outside vehicle battery (not shown) of the electronic control unit 1 to the actuators, and cut or make these power paths on the basis of control signals from the control processing element 3.

The drive elements 5 also are provided inside the box 7 like the control processing element 3, but are mounted on a separate board (the drive circuit board 11) from the control circuit board 9 on which the control processing element 3 is mounted. This drive circuit board 11 on which the drive elements 5 are mounted is a ceramic board having superior thermal radiation property, which is for forming driving circuits constituting a part of the power paths for supplying power to the actuators. Various electronic components (not shown) including the drive elements 5 are mounted on the face (the upper face) of the drive circuit board 11 facing the control circuit board 9, whereby predetermined driving circuits are formed.

Figure 3A:
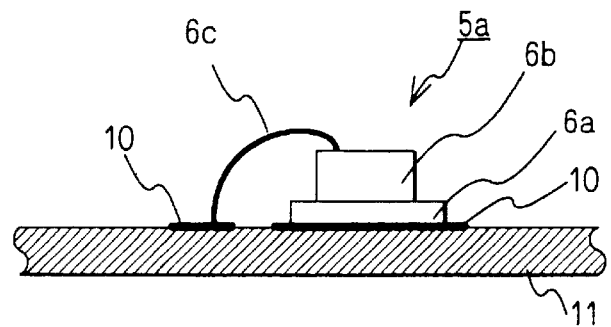
FIGS. 3A and 3B are cross-sectional views schematically showing drive elements.
Figure 3B:
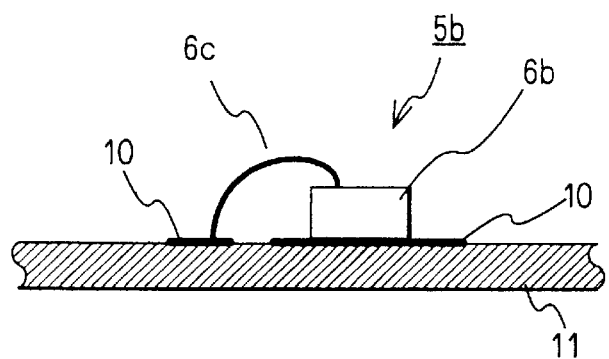

As shown in FIGS. 3A and 3B, the drive elements 5 of this embodiment are so-called bare chip type transistors (ones of a type wherein semiconductor chips are not received in packages of resin or the like). The necessary power differs among the actuators that are the control objects, and because there are also differences in the amount of heat produced by the respective drive elements 5, different types of drive elements are sometimes used in correspondence with differences in power amount (i.e. differences in amount of heat produced).

That is, when the amount of heat produced is likely to be large, as shown in FIG. 3A, a type of drive element wherein a semiconductor chip 6b is mounted on the board through a radiation fin 6a is used as the drive element 5a. When the amount of heat produced is likely to be relatively small, as shown in FIG. 3B, another type of drive element wherein a semiconductor chip 6b is directly mounted on the board without a radiation fin being interposed therebetween is used as the drive element 5b. It should be noted that the drive elements 5 includes these different types of drive elements 5a, 5b.

The drive elements 5 are mounted on an interconnection pattern 10 formed on the board 11, and one electrode of each of the drive elements 5 (in this embodiment a collector electrode) is electrically connected to the interconnection pattern 10 directly or by way of the radiation fin 6a. The other electrodes (in this embodiment, a base electrode and an emitter electrode) are electrically connected to the interconnection pattern via bonding wires 6c made of gold or aluminum or the like.

The control circuit board 9 on which is formed the control circuit comprising the control processing element 3 and the drive circuit board 11 on which is formed the drive circuit comprising the drive elements 5 are electrically connected to each other by a flexible printed circuit board (flexible board) 13 as a connecting wire. The flexible board 13 has excellent elasticity and is soldered to end parts of the control circuit board 9 and the drive circuit board 11 to be electrically connected to the interconnection patterns on the boards 9, 11.

The bonding portion of the flexible board 13 on the control circuit board 9 is positioned in the vicinity of the connector 2, and specifically is provided on a back side part of the mounting location of the connector 2 on the control circuit board 9. The flexible board 13 is bent into a U-shape having a suitable bend between the two boards 9 and 11, and is disposed so that a gap is formed between itself and the box 7 (particularly, a box bottom part 7b, a box cylindrical part 7c and board support parts 7f, which will be discussed later). The flexible board 13 is also disposed so that a gap is provided between the electronic components mounted on the two boards 9, 11.

Here, FIG. 4 is a view showing the mutually facing faces of the control circuit board 9 and the drive circuit board 11 that are connected by the flexible board 13. That is, in FIG. 4, it is shown from the direction of the upper face of the drive circuit board 11, but with respect to the control circuit board 9, it is shown in a state inverted by 180° about the flexible board 13 (that is, upside down). As will be discussed later, the lower face of the drive circuit board 11 is provided in close adhesion with the box bottom part 7b that serves as a radiation plate.

Next, along with this FIG. 4, an example of a flow of signals in the electronic control unit 1 in this embodiment will be described.

When a signal from an outside sensor (a sensor signal) is transmitted to the connector 2, the sensor signal is transmitted to an input terminal of the control processing element 3 through a connector pin 8a and an interconnection pattern 15a formed on the upper face of the control circuit board 9 (that is, the back face of the face facing the drive circuit board 11). Various signals are inputted to the control processing element 3 also via paths other than those shown. Then, the control processing element 3 executes computational processing based on the various inputted signals, and outputs control signals for drive-controlling the outside control objects.

The output signals outputted toward the drive elements 5 from an output terminal of the control processing element 3 are transmitted to the flexible board 13 through an interconnection pattern 15b formed on the upper face of the control circuit board 9, a via hole 17 passing through the control circuit board 9, and an interconnection pattern 15c formed on the lower face of the control circuit board 9. In this embodiment, in connection with the fact that the bonding portion of the flexible board 13 on the control circuit board 9 is disposed on the back side part of the connector 2, the interconnection pattern 15c is formed to pass through a space between the connector pins 8.

Then the control signals are transmitted through an interconnection pattern 19a of the flexible board 13 to the drive circuit board 11, and further are transmitted through an interconnection pattern 21a formed on the upper face of the drive circuit board 11 to an input terminal (in this preferred embodiment, a base electrode) of the drive element 5b. The drive element 5b is turned on or turned off in correspondence with the control signals, and makes or breaks the power path to the outside actuator.

When this drive element 5b is turned on, the power path, which is composed of an interconnection pattern 21b formed on the upper face of the drive circuit board 11, an interconnection pattern 19b of the flexible board 13, and an interconnection pattern 15d formed on the lower face of the control circuit board 9 and an connector pin 8b and so on, is made, and powering of that actuator is carried out. The interconnection patterns 15d, 19b, 21b constituting the power path of the outside control object are formed wider in width than the interconnection patterns 15a through 15c, 19a, 21a constituting the transmission path of sensor signals and control signals to prevent heat generation and voltage drop even when a large current is passed through.

The control circuit board 9 and the drive circuit board 11 connected to each other in this way are received in the box 7 as shown in FIG. 2A. The walls of the box 7 receiving these two boards 9, 11 are made by casting a metal (in this embodiment, aluminum), and are made up of a box lid part 7a, the box bottom part 7b and the box cylindrical part 7c.

The box lid part 7a is formed as a cylindrical body having one end (closed end) closed, and has a side face opening 7d formed in a side face part of the cylindrical body for exposing the connector 2 to the outside. At the opposite end of the box lid part 7a to the above-mentioned closed end, an end opening 7e of substantially the same shape as the control circuit board 9 is formed, and the control circuit board 9 can be fitted in that end opening 7e. When the control circuit board 9 is fitted in the end opening 7e, the box lid part 7a covers the face of the control circuit board 9 on which the connector 2 is mounted.

The box bottom part 7b is disposed on the opposite side of the control circuit board 9 from the box lid part 7a, with the box cylindrical part 7c interposed therebetween. The box bottom part 7b is for making it easy for heat produced in the electronic control unit 1 (particularly the drive elements 5) to be released to outside the box 7, and is constructed as a thick (for example thicker than the box lid part 7a) radiation plate so that it can absorb heat swiftly. The drive circuit board 11 is mounted in close adhesion with the inner surface of the box bottom part 7b (the upper side in FIG. 2A) so that heat produced in the drive elements 5 is efficiently released by the box bottom part 7b. That is, the box bottom part 7b forms the wall constituted as a radiation plate.

The box cylindrical part 7c is formed as a cylindrical body with a cross-section having the same shape as the box lid part 7a and both ends open, and is connected to the box lid part 7a and the box bottom part 7b at the two ends. The box cylindrical part 7c, as shown in FIG. 2A, constitutes a side face part of the box 7 together with the box lid part 7a, and cuts off the space between the control circuit board 9 and the drive circuit board 11 (that is, the control circuit board 9 and the box bottom part 7b) from the space outside the box 7. Board support parts 7f for supporting the control circuit board 9 are provided on the box cylindrical part 7c.

To assemble the electronic control unit 1 having the construction described above, it is preferably carried out with the order explained next (see FIGS. 5A to 5C). First, electronic components including the drive element 5a are mounted on the drive circuit board 11 to form a predetermined drive circuit. Then, the lower face of the drive circuit board 11 with the drive circuit mounted on it (that is, the back side face of the face on which the drive elements 5 are mounted) is brought into close adhesion with the box bottom part 7b serving as a radiation plate as shown in FIG. 5A.

To bring the drive circuit board 11 into close adhesion with the box bottom part 7b, the two are brought face to face with an adhesive having superior thermal conductivity therebetween, and held for a predetermined time (for example about 30 minutes) at a high temperature (for example about 150° C.). By thermally hardening the adhesive in this way, the drive circuit board 11 and the box bottom part 7b are bonded in close adhesion and the thermal resistance between the drive circuit board 11 and the box bottom part 7b is made small.

For the control circuit board 9 also, various electronic components including the connector 2 and the control processing element are mounted on it to form a predetermined control circuit.

Next, the drive circuit board 11 adhered to the box bottom part 7b and the control circuit board 9 are disposed lined up in the same plane S. At this time, the faces of the two boards 9, 11 to be facing each other are made to face in the same direction. Then as shown in FIG. 5B, from one side of that plane S (specifically, the side of the faces of the two boards 9, 11 which are to face each other), the flexible board 13 is brought close, and is bonded by soldering and thermo compression bonding to the adjacent end parts of the two boards 9, 11 disposed side by side. The flexible board 13 is bonded to the two boards 9, 11 by applying solder to the surfaces of the two boards 9, 11, which are to become these bonding portions, and by melting the solder with the flexible board 13 pressed against it with a pre-heated crimping jig (not shown).

After that, as shown in FIG. 5C, by the drive circuit board 11 (or the control circuit board 9, or the two boards 9, 11) being turned about the flexible board 13, the two boards 9, 11 are made to face each other (that is, so that they overlap), and received inside the box 7 described above.

With the electronic control unit 1 of this embodiment constructed as described above, the following effects are obtained.

Because the drive elements 5 and the control processing element 3 are mounted on the mutually different separate boards 9, 11, heat transmitted from the drive elements 5 to the control processing element 3 can be reduced. Because of this, even if, in the future the power handled by the drive elements 5 increases, or the number of drive elements 5 increases so that the amount of heat produced in the drive elements 5 increases, the influence of heat reaching the control processing element 3 can be suppressed.

Because the box bottom part 7b of the electronic control unit 1 is constructed as a radiation plate and the drive circuit board 11 with the drive elements 5 mounted on it is provided in close adhesion with the inner side surface of this box bottom part 7b serving as a radiation plate, even if the drive elements 5 produce heat, through the radiation plate the heat can be swiftly discharged to outside the box 7 (that is, outside the electronic control unit 1). Because of this, the influence on the control processing element 3 of heat produced by the drive elements 5 can be further suppressed, and rising in temperature of the drive elements 5 can also be suppressed.

Because the control circuit board 9 and the drive circuit board 11 are disposed to face each other, the increase in size of the electronic control unit 1 can be suppressed. The bonding portion of the flexible board 13 on the control circuit board 9 is provided in the vicinity of the connector 2. Specifically, the connector 2 is mounted on the back side face of the face of the control circuit board 9 facing the drive circuit board 11 and the flexible board 13 is bonded to the control circuit board 9 at the back side part of the connector 2.

Because of this, layout hindrances, which can arise due to the flexible board 13 being bonded to the control circuit board 9, can be greatly reduced. The area of the interconnection pattern for the power path on the control circuit board 9 can be reduced, and accordingly, the circuit design for the control circuit board 9 becomes easy. Because the path length between the drive element 5 and the connector 2 is shortened, the voltage drop between the two can also be suppressed.

Further, because the back side part of the connector 2 on the control circuit board 9 usually holds parts as noise countermeasures and the interconnection patterns leading from the connector 2 to the control processing element 3 are few on the back side part, the degree of freedom on design is high for the parts and interconnection patterns. Therefore, bonding the flexible board 13 to the back side part of the connector 2 greatly decreases the limitation of layout on design.

Because the connector 2 is mounted on the control circuit board 9 at the back side face of the face facing the drive circuit board 11, the face to which the flexible board 13 is bonded faces the drive circuit board 11. Because of this, the control circuit board 9 and the drive circuit board 11 can be connected to overlap with each other (that is, to face each other) without hindrance.

Because the connector 2 is mounted on the end part of the control circuit board 9 and the flexible board 13 also is bonded to the end parts of the two boards 9, 11, the degree of freedom of layout of interconnection patterns and electronic components (including also the control processing element 3 and the drive elements 5) can be made higher. Because the flexible board 13 is used as a connecting wire for connecting the control circuit board 9 and the drive circuit board 11, making small of the electronic control unit 1 can be further promoted, and the number of parts can be reduced. However, it is apparent that several separate wires or the like can be used instead of the flexible board 13 for connecting the two boards 9, 11.

Of the interconnection patterns formed on the flexible board 13, the interconnection pattern 19b forming the power path leading from the drive elements 5 through the connector 2 to the control object is made wider in width than the interconnection pattern 19a forming the control signal transmission path leading from the control processing element 3 to the drive elements 5. This is because in the transmission path the control signal flows with a small current, and in the power path a large current flows for supplying power to the control objects. Thus, it is possible to prevent voltage drop and heat generation in the flexible board 13 while suppressing increase in size of the flexible board 13, by changing the widths of the interconnection patterns in accordance with the magnitudes of current flowing in the patterns.

When the control circuit board 9 and the drive circuit board 11 are electrically connected to each other, the drive circuit board 11 and the control circuit board 9 are lined up in the same plane and the flexible board 13 is bonded to the mutually adjacent end parts of the two boards 9, 11 disposed in this state by soldering and thermo compression bonding from one side of that plane. With this method, because the electrical connection of the two boards 9, 11 can be achieved simply, and the manufacturing process of the electronic control unit 1 can be made a simple one. By extension it is possible to suppress its manufacturing cost.

Because the drive circuit board 11 is brought into close adhesion with the box bottom part 7b before the control circuit board 9 and the drive circuit board 11 are connected to each other with the flexible board 13, the manufacturing process of the electronic control unit 1 can be made a more simple one. Further, because the bonding of the drive circuit board 11 to the box bottom part 7b, i.e., the radiation plate generally requires a high temperature (about 150° C. in this embodiment) for hardening the adhesive, it is preferable to perform the bonding without the control circuit board 11 not to cause deficiencies on the control circuit board 11.

The flexible board 13 is bonded to the mutually facing end parts of the two boards 9, 11 and is bent to form a gap between itself and the box 7. Further, the flexible board 13 has a specific length that allows the two boards 9, 11 to be disposed lined up in the same plane S not to overlap each other in a state where the boards 9, 11 are mutually connected as shown in FIGS. 5B and 5C. Accordingly, the two boards 9, 11 can be connected by a simple process. As a result, the manufacturing process of the electronic control unit 1 can be made simple, and manufacturing cost can be suppressed.

Because the flexible board 13 is bent between the mutually facing boards 9, 11 to form a gap between itself and the wall face of the box 7, the flexible board 13 and the bonding portions between the flexible board 13 and the respective boards 9, 11 are suppressed from undergoing stress, and simultaneously the flexible board 13 is prevented from being damaged by rubbing with the box 7 caused by vibrations or the like from the outside.

Further, because the flexible board 13 is bent into a U-shape, even when a force of some kind is applied to the flexible board 13, the force can be dispersed to the entire portion of the flexible board 13. The force is difficult to be applied to the flexible board 13 locally, so that deficiencies of electrical connection such as breakages on the flexible board 13 can be prevented. It is undesirable that the flexible board 13 is stretched between the two boards 9, 11 such that tensile stress is applied to the bonding portions of the flexible board 13. Furthermore, the flexible board 13 is provided so that a gap is provided between the electronic components mounted on the two boards 9, 11. Therefore, the flexible board 13 is difficult to contact the electronic components, and accordingly the possibility of causing deficiencies to the flexible board 13 and the electronic components is lowered.

Second Embodiment

Next, a second preferred embodiment of the present invention will be explained in which the same parts and components as in the first embodiment are indicated with the same reference numerals.

Figure 6:
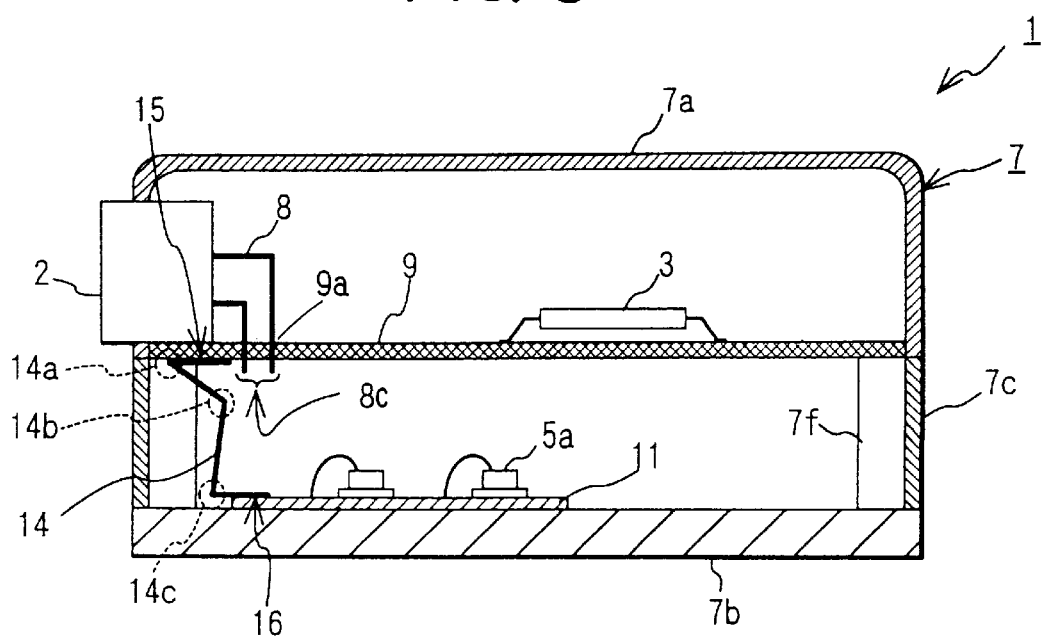
FIG. 6 is an explanatory view showing an electronic control unit as seen from a direction parallel with a control circuit board in a second preferred embodiment.

In the electronic control unit 1 in the second embodiment as shown in FIG. 6, the control circuit board 9 and the drive circuit board 11 are mutually connected by a flexible board 14, instead of the flexible board 13 in the first embodiment. The flexible board 14 has several folds at specific portions (three portion in this embodiment) between a bonding portion 15 with the control circuit board 9 and a bonding portion 16 with the drive circuit board 11. The flexible board 14 is bent to have a first folded portion 14a, a second folded portion 14b, and a third folded portion 14c in this order from the side of the boding portion 15 with the control circuit board 9.

The first folded portion 14a is formed by the fold closest to the bonding portion 15 with the control circuit board 9, and protrudes in a direction progressing from the projecting portions 8c of the connector pins 8 toward the bonding portion 15. The third folded portion 14c is formed by the fold farthest from the bonding portion 15 with the control circuit board 9 (that is, closest to the bonding portion 16 with the drive circuit board 11), and protrudes in the direction progressing from the projecting portions 8c of the connector pins 8 toward the bonding portion 15. The second folded portion 14b is formed by the fold provided between the fold forming the first folded portion 14a and the fold forming the third folded portion 14c, and protrudes in the direction progressing from the bonding portion 15 toward the projecting portions 8c of the connector pins 8.

Because the second folded portion 14b is formed into a shape protruding in the direction progressing from the bonding portion 15 toward the projecting portions 8c of the connector pins 8, the flexible board 14 has a possibility to contact the projecting portions 8c of the connector pins 8. In this connection, the second folded portion 14b should be located at the side of the bonding portion 15 between the flexible board 14 and the control circuit board 9 with respect to the projecting portions 8c of the connector pins 8. The electronic control unit 1 of this second embodiment is constructed such that all of the folded portions 14a, 14b, 14c are positioned at the side of the bonding portion 15 between the flexible board 14 and the control circuit board 9 with respect to the projecting portions 8c of the connector pins 8.

The other features of the electronic control unit 1 in the second embodiment are substantially the same as those in the first embodiment, and those explanations are omitted.

According to the electronic control unit 1 constituted as above in the second embodiment, in addition to the effects described in the first embodiments, the following effects are provided.

The flexible board 14 is formed with several folds in advance, and is disposed between the two boards 9, 11 in a state where it is bent at the respective folds. Therefore, the shape of the flexible board 14 to be formed between the two boards 9, 11 facing each other can be determined in advance. The flexible board 14 therefore can be securely prevented from contacting the wall face of the box 7.

The folded portions of the flexible board 14 is positioned at the side of the bonding portion 15 between the flexible substrate 14 and the control circuit board 9 with respect to the projecting portions 8c of the connector pins 8. Therefore, the flexible board 14 can be prevented from contacting the projecting portions 8c of the connector pins 8 inserted into the through holes 9a of the control circuit substrate 9, and from being damaged by the connector pins 8.

Figure 7A:
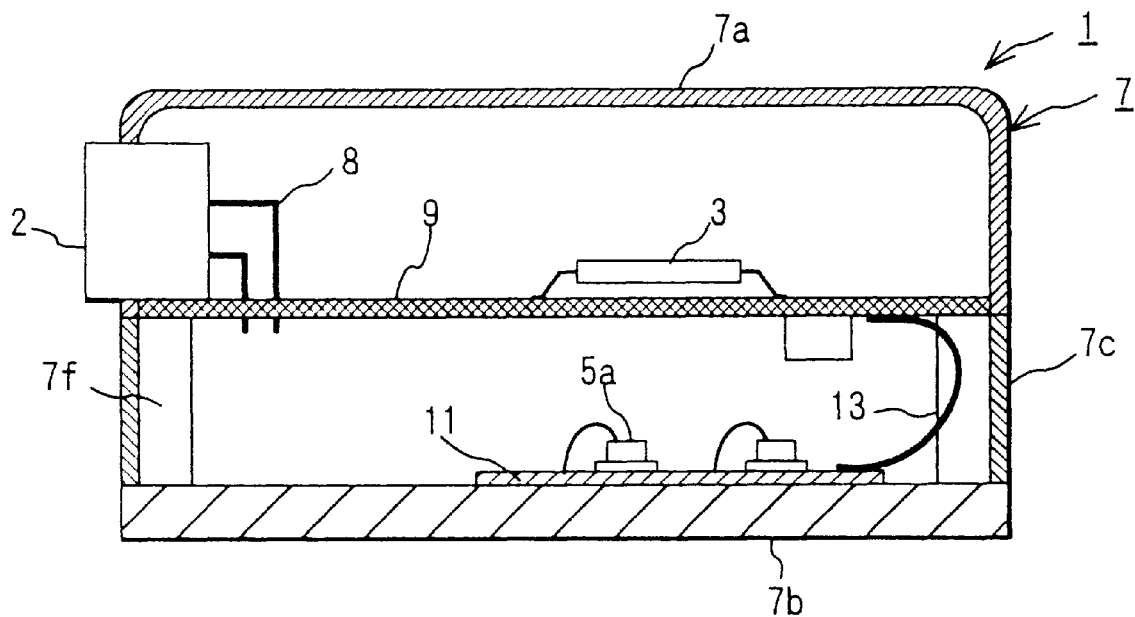
FIGS. 7A and 7B are explanatory views showing modified electronic control units in the second embodiment.
Figure 7B:
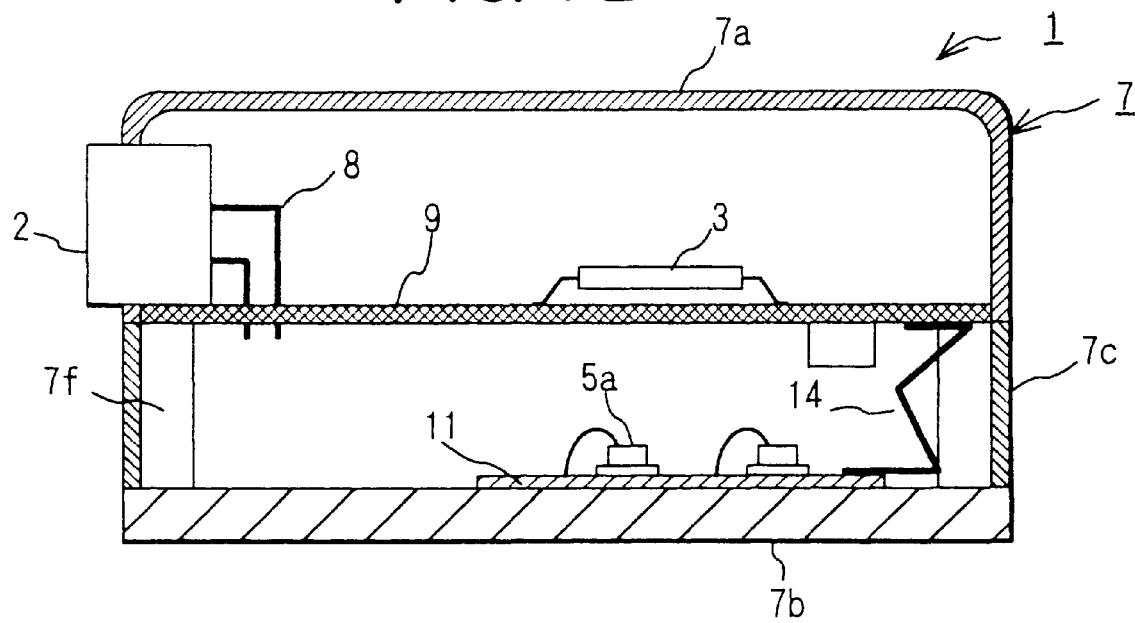

Although in the electronic control units 1 of the first and second embodiments, the flexible board 13, 14 is connected to the control circuit board 9 in the vicinity of the connector 2, it is not limited to this. The flexible board 13, 14 may be bonded to a location apart from the connector 2 (for example, as shown in FIGS. 7A and 7B, an end part at an opposite side of the connector 2). In this case also the flexible board 13, 14 is provided to form gaps with the wall face of the box 7, and the electronic components mounted on the boards 9, 11 not to contact these parts.

Figure 8A:
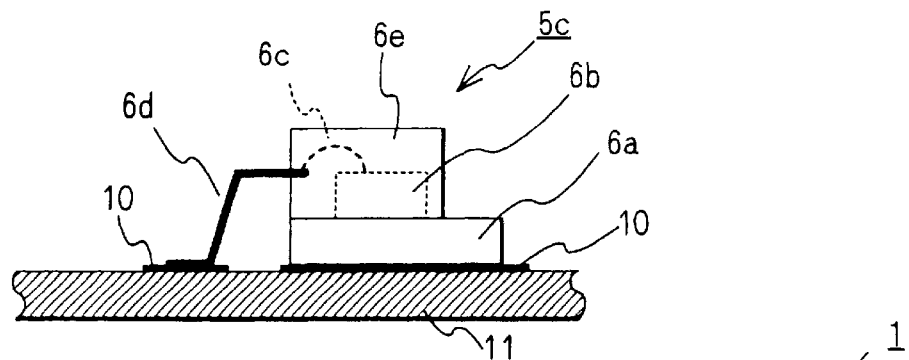
FIGS. 8A to 8C are explanatory views showing another embodiment of an electronic control unit pertaining to the invention.
Figure 8B:
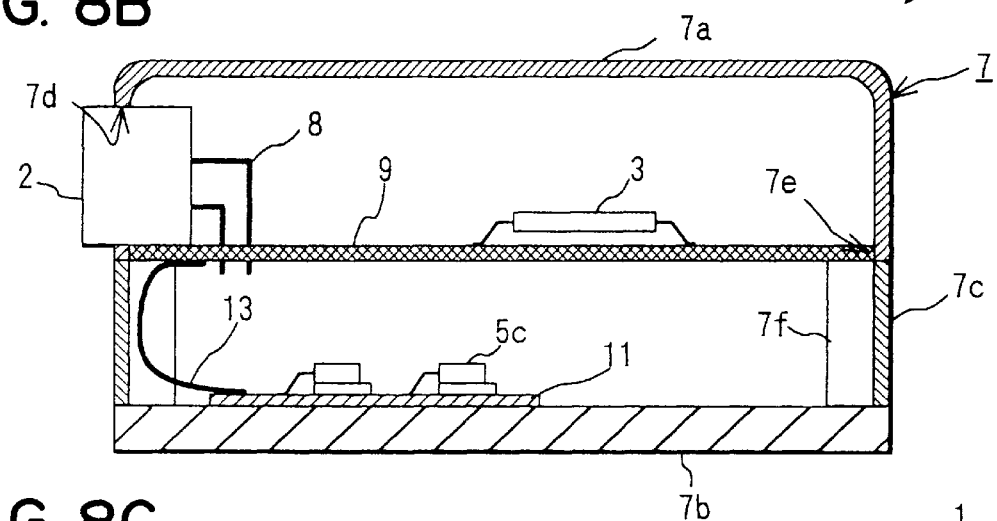
Figure 8C:
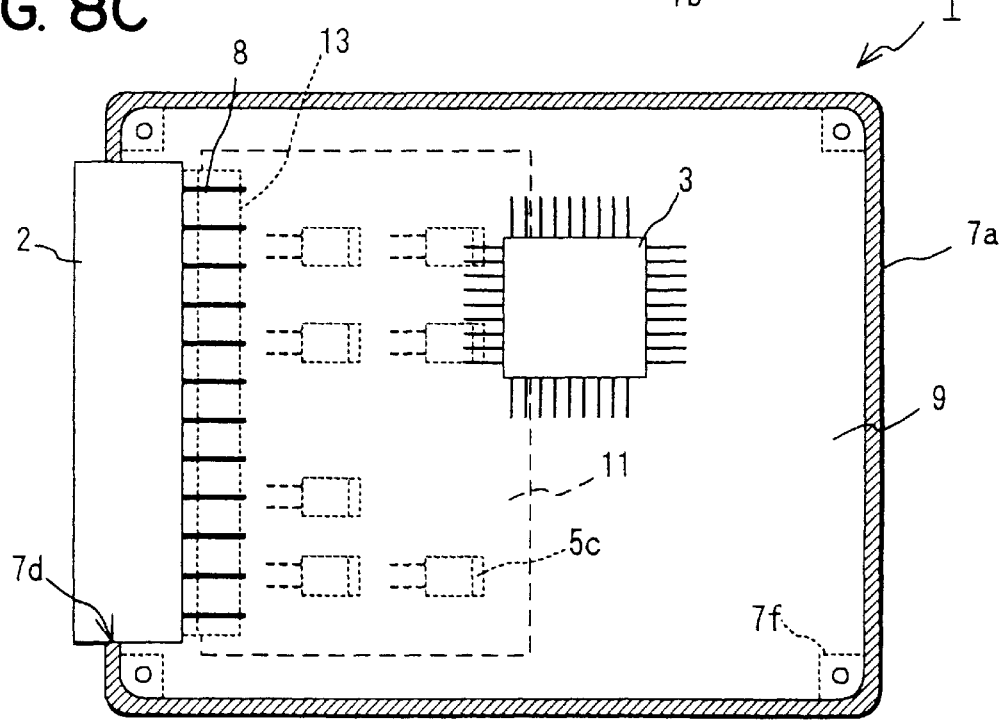

Although in the embodiments described above, as shown in FIGS. 3A and 3B, the bare chip type transistors are used as the drive elements 5, it is not limited to this. For example, as shown in FIG. 8A, a drive element 5c of a type (a so-called molded type) wherein resin is molded around a semiconductor chip 6b can be used. The molded type drive element 5c shown in FIG. 8A has an electrode lead 6d fixed in a resin part 6e together with the semiconductor chip 6b, and is connected to an interconnection pattern 10 via the electrode lead 6d and a radiation fin 6a. The electrode lead 6d is connected to the semiconductor chip 6b via a bonding wire 6c, and the radiation fin 6a is connected to the semiconductor chip 6b directly. Even when this kind of drive element 5c is used, the electronic control unit 1 of the embodiments described above can be constructed substantially in the same way as shown in FIGS. 8B and 8C.

Third Embodiment

A third preferred embodiment of the present invention will be explained referring to FIGS. 9A and 9B in which the same parts and components as in the first embodiment are indicated with the same reference numerals.

Figure 9A:
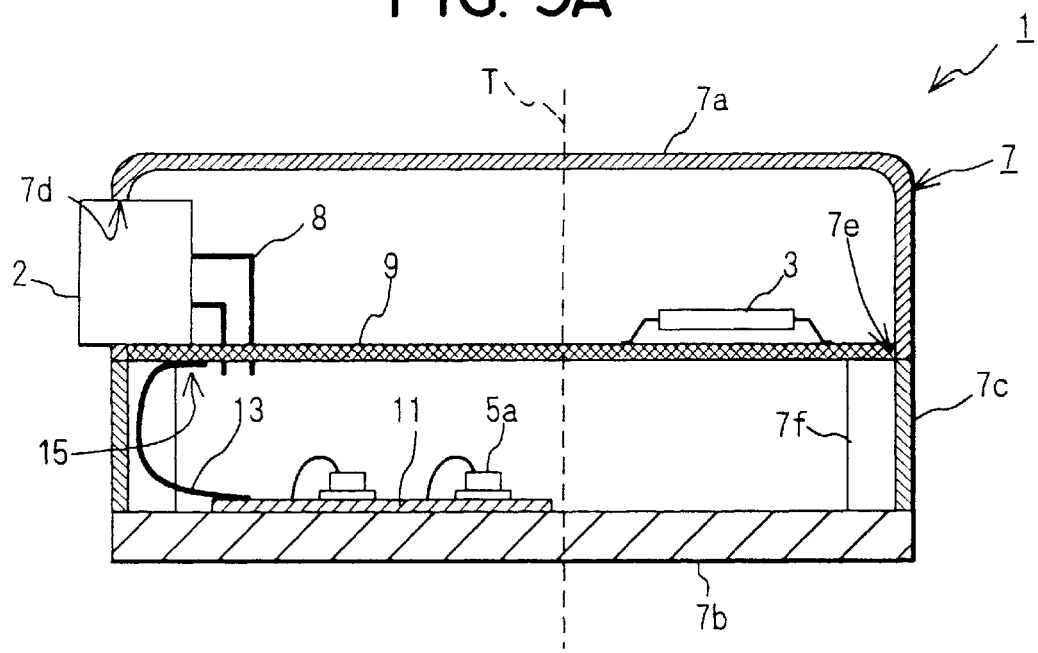
FIG. 9A is an explanatory view showing an electronic control unit as seen in a direction parallel with a control circuit board in a third preferred embodiment.
Figure 9B:
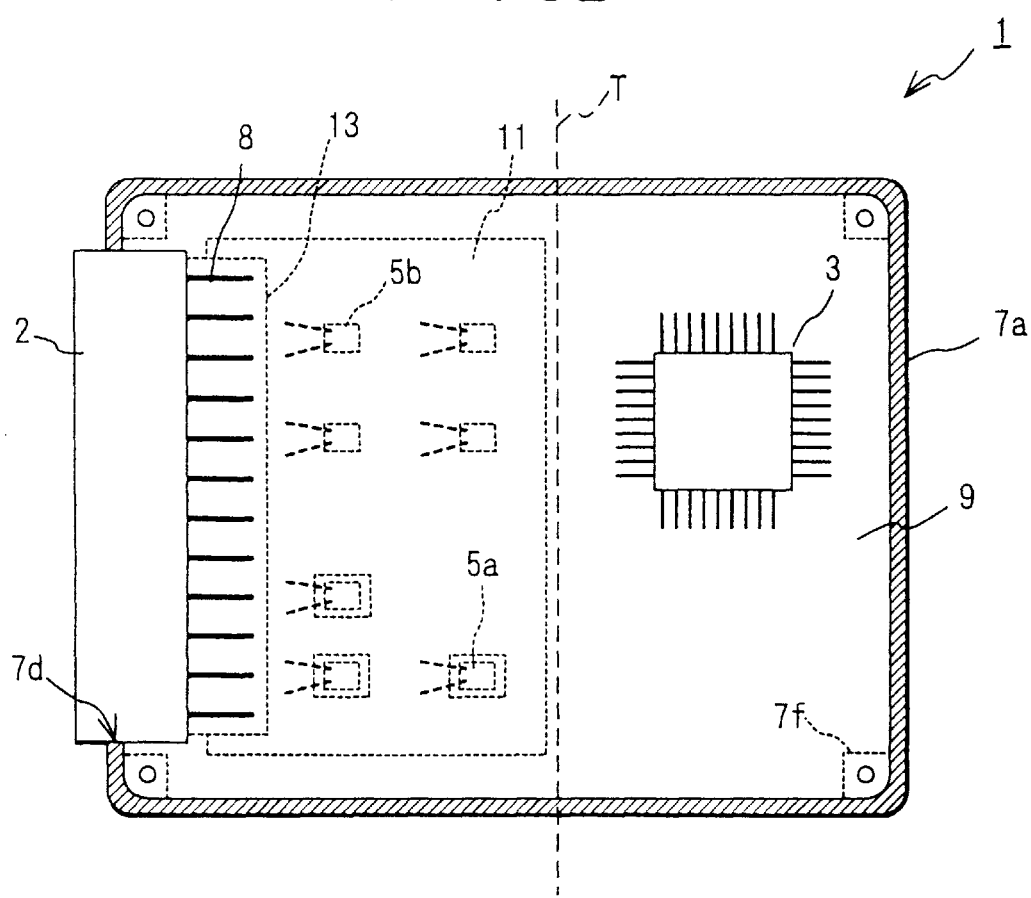
FIG. 9B is an explanatory view showing the electronic control unit as seen in a direction perpendicular to the control circuit board in the third embodiment.

As shown in FIGS. 9A and 9B, in the third embodiment the control processing element 3 mounted on the control circuit board 9 and the drive element 5 mounted on the drive circuit board 11 are disposed separately from each other. Specifically, assuming a virtual plane T perpendicular to the wall face of the drive circuit board 11 (box bottom part 7b), the control processing element 3 and the drive element 5 are positioned at opposed sides to each other with the plane T intervening between the two. The connector 2 and the drive circuit board 11 are also disposed at the side of the drive circuit board 5 with respect to the virtual plane T between the two elements 3, 5, and are mutually connected by the flexible board 13.

According to this third embodiment, because the two elements 3, 5 are disposed not to overlap each other in the direction perpendicular to the drive circuit board 11, heat is suppressed from being transferred from the drive element 5 to the control processing element 3. The size of the electronic control unit 1 can be reduced. Further, the connector 2 is disposed at the side of the drive element 5 with respect to the virtual plane T. Because of this, the power path between the drive element 5 and the connector 2 can be shortened, and voltage drop, i.e., power loss can be suppressed. The other features and effects are substantially the same as those in the first embodiment.

Fourth Embodiment

Figure 10A:
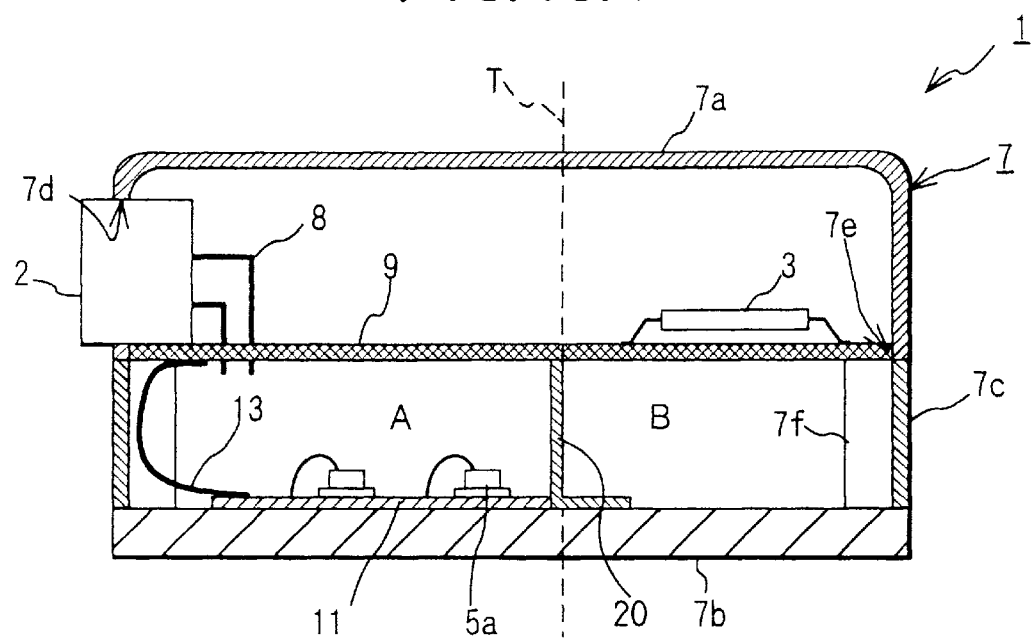
FIG. 10A is an explanatory view showing an electronic control unit as seen in a direction parallel with a control circuit board in a fourth preferred embodiment.
Figure 10B:
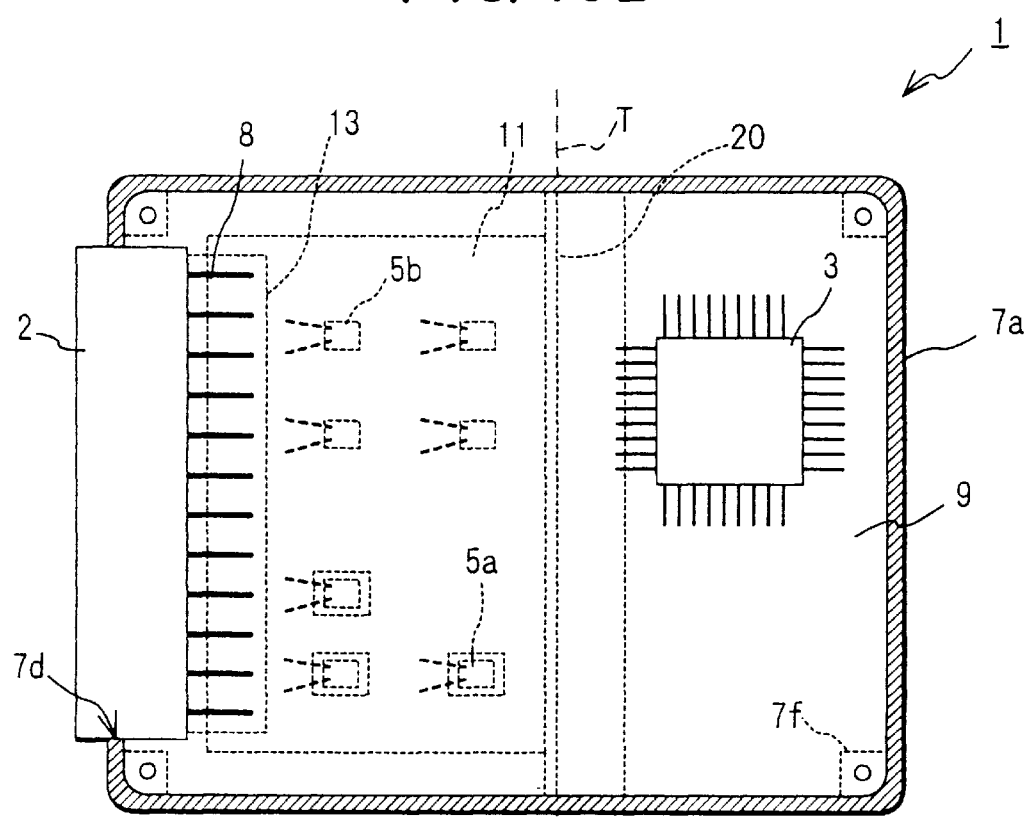
FIG. 10B is an explanatory view showing the electronic control unit as seen in a direction perpendicular to the control circuit board in the fourth embodiment.

In a fourth preferred embodiment of the present invention, as shown in FIGS. 10A and 10B, a resin-made heat interception plate 20 is provided, along the virtual plane T, in a space defined between the wall face as a radiation plate (box bottom part 7b) on which the drive circuit board 11 is mounted and the control circuit board 9. The heat interception plate 20 is shaped generally into an L-shape, and has a base part (forming a bottom part of the L-shape) disposed directly on the box bottom part 7b being provided as the radiation plate.

The heat interception plate 20 divides the space defined between the box bottom part 7b and the control circuit board 9 into two spaces (space A containing the drive element 5 and space B in the vicinity of the control processing element 3). That is, the heat interception plate 20 intercepts convection flowing between the space A at the drive element side and the space B at the control processing element side. Accordingly, atmosphere having received heat of the drive element 5 is prevented from approaching the vicinal region of the control processing element 3.

According to the fourth embodiment, heat transfer from the drive element 5 to the control processing element 3 due to the convection of atmosphere can be suppressed. Radiation heat can also be prevented from being transferred from the drive element 5 to the control processing element 3.

Because the heat interception plate 20 is made of resin being a material having a low thermal conductivity, thermal conduction from the space A at the drive element side to the space B at the control processing element side can be further suppressed. Also, heat is suppressed from being transferred from the drive circuit board 11 (the box bottom part 7b as the radiation plate) to the control circuit board 9 through the heat interception plate 20. The other features and effects are substantially the same as those in the above embodiments.

Although in the electronic control unit 1 of the fourth embodiment it is explained that the heat interception plate 20 is provided along the virtual plane T perpendicular to the box bottom part 7b holding the drive circuit board 11 thereon, it is not limited to this. The heat interception plate 20 can have various shapes and be determined in accordance with the layout of the electronic components mounted in the box 7 as long as the convection is prevented from flowing between the space in the vicinity of the drive element 5 and the space in the vicinity of the control processing element 3.

Figure 11:
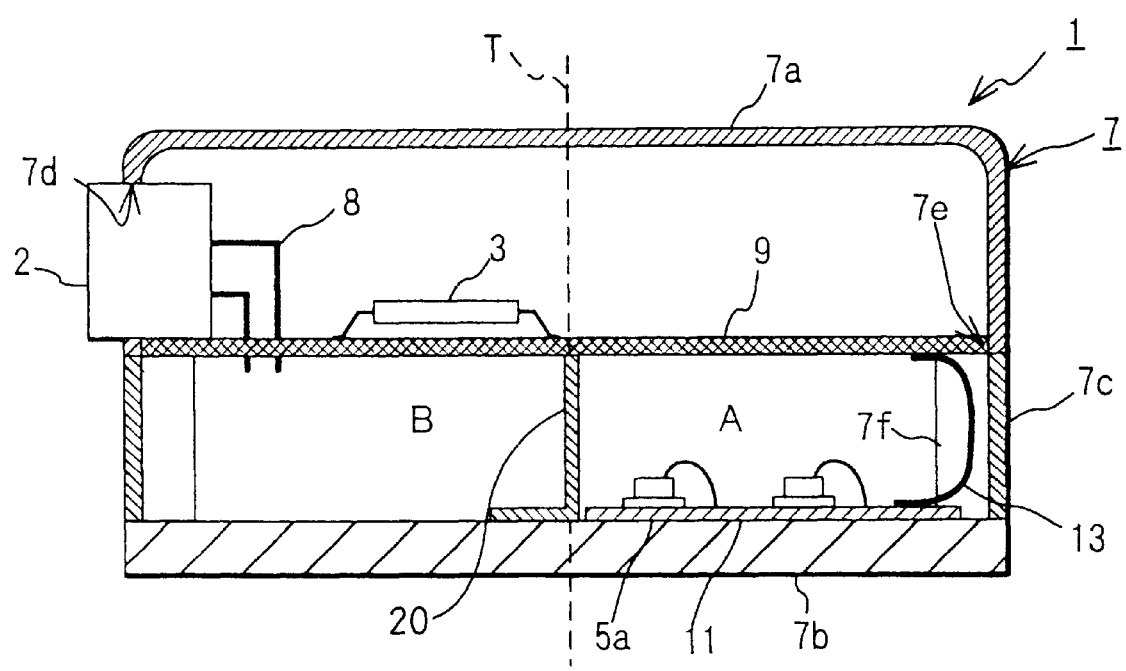
FIG. 11 is an explanatory view showing a modified electronic control unit in the fourth embodiment.

Although in the electronic control unit 1 in the third and fourth embodiments, the connector 2 is provided at the side of the drive element 5 with respect to the virtual plane T, it is not limited to this. For example as shown in FIG. 11, the connector 2 may be provided at the side of the control processing element 3.

Also in the third and fourth embodiments, the drive elements 5 are not limited to the bare chip type transistors shown in FIGS. 3A and 3B, and for example a drive element 5c of a type (a so-called molded type) shown in FIG. 8A wherein resin is molded around a semiconductor chip 6b can be used as in the other embodiments. Even when this kind of drive element 5c is used, for example the electronic control units 1 can be constructed substantially in the same way as in the embodiments above as shown in FIGS. 12A and 12B.

In the electronic control unit of the embodiments described above, it is described as one for driving and controlling actuators provided in an engine of a vehicle, but it is clear that it is not limited to this.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electronic control unit comprising:
    a box having an inner wall part serving as a radiation plate;
    a drive circuit board disposed in close adhesion with the radiation plate in the box;
    a control circuit board disposed in the box and facing the drive circuit board;
    a connecting wire connecting the drive circuit board and the control circuit board;
    a connector disposed on the control circuit board;
    a drive element disposed on the drive circuit board for supplying power to an outside control object through the connector; and
    a control processing element disposed on the control circuit board for performing a control processing based on a signal inputted from an outside of the box through the connector and outputting a control signal in accordance with a result of the control processing to the drive element to control the outside control object, wherein the connecting wire is connected to the control circuit board at a bonding portion in a vicinity of the connector; and
    wherein the connector integrally has a first connector pin and a second connector pin, the first connector pin being electrically connected to the drive element for transmitting the power from the drive element to the outside control object, the second connector pin being electrically connected to the control processing element for transmitting the signal from the outside of the box to the control processing element.

2. The electronic control unit according to claim 1, wherein:
    the connector is disposed at a specific location on a first surface of the control circuit board at an opposite side of the drive circuit board; and
    the bonding portion of the connecting wire to the control circuit board is a back side portion of the specific location, on a second surface of the control circuit board.

3. The electronic control unit according to claim 1, wherein the connecting wire is bonded to an end part of the control circuit board as the bonding portion and to an end part of the drive circuit board.

4. The electronic control unit according to claim 1, wherein the connecting wire is a flexible printed circuit board.

5. The electronic control unit according to claim 1, wherein the drive circuit board is made of a material having a thermal radiation property superior to that of the control circuit board.

6. The electronic control unit according to claim 1, wherein:
    the drive circuit board is made of a ceramic material; and
    the control circuit board is made of a resin material.

7. The electronic control unit according to claim 1, wherein the connecting wire is separated from a wall of the box.

8. The electronic control unit according to claim 1, wherein the drive element disposed on the drive circuit board electrically communicates with the outside control object inevitably via the connecting wire and the connector disposed on the control circuit board.

9. The electronic control unit according to claim 1, wherein the drive circuit board is connected with the control circuit board at only one end part thereof by the connecting wire.

10. The electronic control unit according to claim 1, wherein:
    the control circuit board divides an inner space of the box into first and second spaces;
    the control processing element is disposed on the control circuit board in the first space; and
    the drive element is disposed on the drive circuit board in the second space.

11. The electronic control unit according to claim 10, wherein the drive circuit board has an area smaller than that of the control circuit board.

12. An electronic control unit comprising:
    a box having an inner wall part serving as a radiation plate;
    a drive circuit board disposed in close adhesion with the radiation plate in the box;
    a control circuit board disposed in the box and facing the drive circuit board;
    a connecting wire connecting the drive circuit board and the control circuit board, wherein the connecting wire is flexible printed circuit board;
    a connector disposed on the control circuit board;
    a drive element disposed on the drive circuit board for supplying power to an outside control object through the connector; and
    a control processing element disposed on the control circuit board for performing a control processing based on a signal inputted from an outside of the box through the connector and outputting a control signal in accordance with a result of the control processing to the drive element to control the outside control object, wherein
    the connecting wire is connected to the control circuit board at a bonding portion in a vicinity of the connector,
    the flexible printed circuit board has a first interconnection pattern constituting a power path extending from the drive element to the control object through the connector, and a second interconnection pattern constituting a control signal transmission path extending from the control processing element to the drive element, the first interconnection pattern being wider in width than the second interconnection pattern.

13. An electronic control unit comprising:
    a box having an inner wall part serving as a radiation plate;
    a drive circuit board disposed in close adhesion with the radiation plate in the box;
    a control circuit board disposed in the box and facing the drive circuit board;

a connecting wire connecting the drive circuit board and the control circuit board, wherein the connecting wire is flexible printed circuit board;

a connector disposed on the control circuit board;

a drive element disposed on the drive circuit board for supplying power to an outside control object through the connector; and a control processing element disposed on the control circuit board for performing a control processing based on a signal inputted from an outside of the box through the connector and outputting a control signal in accordance with a result of the control processing to the drive element to control the outside control object, wherein the connecting wire is connected to the control circuit board at a bonding portion in a vicinity of the connector, the electronic control unit is manufactured by:

disposing the drive circuit board on which the drive element is mounted and the control circuit board on which the connector and the control processing element are mounted to be lined up in an identical plane, electrically connecting the drive circuit board and the control circuit board by soldering the flexible printed circuit board to end parts of the drive circuit board and the control circuit board, which are disposed side by side, from one side of the plane, and housing the drive circuit board and the control circuit board connected to each other in the box such that the drive circuit board and the control circuit board face each other.

14. The electronic control unit according to claim 13, wherein the drive circuit board is bonded to the radiation plate before the drive circuit board and the control circuit board are electrically connected.

15. An electronic control unit comprising:

a box having an inner wall part serving as a radiation plate;

a drive circuit board disposed in close adhesion with the radiation plate in the box;

a control circuit board disposed in the box and facing the drive circuit board;

a connecting wire connecting the drive circuit board and the control circuit board;

a connector disposed on the control circuit board;

a drive element disposed on the drive circuit board for supplying power to an outside control object through the connector;

a control processing element disposed on the control circuit board for performing a control processing based on a signal inputted from an outside of the box through the connector and outputting a control signal in accordance with a result of the control processing to the drive element to control the outside control object, wherein the connecting wire is connected to the control circuit board at a bonding portion in a vicinity of the connector, the control circuit board divides an inner space of the box into first and second spaces, the control processing element is disposed on the control circuit board in the first space, the drive element is disposed on the drive circuit board in the second space, a heat interception plate is disposed in the second space and divides the second space into third and fourth spaces for preventing heat transfer between the third and fourth spaces, wherein the drive element is disposed in the third space, and the control processing element is disposed on the control circuit board at an opposite side of the fourth space.

16. The electronic control unit according to claim 15, wherein the heat interception plate is made of a resin material.

17. The electronic control unit according to claim 1, wherein:

the box has a board support portion on an inner wall thereof; and the control circuit board is supported by the board support portion in the box.

18. An electronic control unit comprising:

a box having an inner wall part serving as a radiation plate;

a drive circuit board disposed in close adhesion with the radiation plate in the box;

a control circuit board disposed in the box and facing the drive circuit board;

a connecting wire connecting the drive circuit board and the control circuit board;

a connector disposed on the control circuit board;

a drive element disposed on the drive circuit board for supplying power to an outside control object through the connector; and a control processing element disposed on the control circuit board for performing a control processing based on asignal imputed from an outside of the box through the connector and outputting a control signal in accordance with a result of the control processing to the drive element to control the outside control object, wherein the connecting wire is bonded to mutually facing end parts of the control circuit board and the drive circuit board, is bent to form a gap with a wall of the box, and has a length that allows the control circuit board and the drive circuit board to be lined up in an identical plane without an overlap.

19. The electronic control unit according to claim 18, wherein the connecting wire is bent generally into a U-shape between the control circuit board and the drive circuit board.

20. The electronic control unit according to claim 18, wherein the connecting wire is bent with a plurality of folds between the control circuit board and the drive circuit board.

21. The electronic control unit according to claim 18, wherein:

the connector is disposed on the control circuit board at an opposite side of the drive circuit board, and is electrically connected with the control circuit board through a connector pin inserted into a through hole provided in the control circuit board; and the connecting wire is bonded to a bonding portion of the control circuit board at a back side portion of the connector, and is bent with a folded portion that is positioned at a side of the bonding portion with respect to the connector pin.

22. The electronic control unit according to claim 18, further comprising an electronic component disposed on the drive circuit board, wherein:

the connecting wire connects the control circuit board and the drive circuit board in the box to define a gap between the electronic component and the control circuit board.

23. An electronic control unit comprising:
a box having an inner wall part serving as a radiation plate;
a drive circuit board disposed in close adhesion with the radiation plate in the box;
a control circuit board disposed in the box to face the drive circuit board, and electrically connected with the drive circuit board;
a connector disposed on the control circuit board;
a drive element disposed on the drive circuit board for supplying power to an outside control object through the connector; and
a control processing element disposed on the control circuit board for performing a control processing based on a signal imputed from an outside of the box through the connector and outputting a control signal in accordance with a result of the control processing to the drive element to control the outside control object,
wherein the control processing element and the drive element are disposed at opposite sides to each other with a plane interposed therebetween, the plane being approximately perpendicular to the inner wall part of the box on which the drive circuit board is disposed.

24. The electronic control unit according to claim 23, further comprising a heat interception plate extending from the inner wall part of the box to the control circuit board to intercept heat transfer from the drive element to the control processing element.

25. The electronic control unit according to claim 23, wherein the connector is disposed at a side of the drive element with respect to the plane.

26. An electronic control unit comprising:
a box having an inner wall part serving as a radiation plate;
a drive circuit board disposed on the radiation plate in the box;
a control circuit board disposed in the box and facing the drive circuit board;
first and second connector pins fixed to the control circuit board;
a connecting member connecting the drive circuit board and the control circuit board;
a drive element disposed on the drive circuit board and electrically connected to the first connector pin, for supplying power to an outside control object through the first connector pin; and
a control processing element disposed on the control circuit board and electrically connected to the second connector pin, for performing a control processing based on a signal inputted from an outside of the box through the second connector pin and for outputting a control signal in accordance with a result of the control processing to the drive element to control the outside control object, wherein
the first and second connector pins are provided on a same side of the control circuit board as each other with respect to the drive element.

27. The electronic control unit according to claim 26, wherein the connecting member is connected to the control circuit board on the same side of the control circuit board as the first and second connector pins with respect to the drive element.

28. The electronic control unit according to claim 27, wherein the first and second connector pins protrude from a common connector disposed on the control circuit board.

29. The electronic control unit according to claim 28, wherein the connector and the connecting member are respectively fixed to opposite surfaces of the control circuit board on the same side with respect to the drive element.

30. The electronic control unit according to claim 26, wherein the drive element and the control processing element are electrically connected to each other through the connecting member.

* * * * *